United States Patent
Oon et al.

(10) Patent No.: US 8,089,086 B2
(45) Date of Patent: Jan. 3, 2012

(54) LIGHT SOURCE

(75) Inventors: Siang Ling Oon, Bukit Mertajam (MY); Chin Nyap Tan, Sungai Jawi (MY); Kee Yean Ng, Prai (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 123 days.

(21) Appl. No.: 12/581,755

(22) Filed: Oct. 19, 2009

(65) Prior Publication Data

US 2011/0090698 A1     Apr. 21, 2011

(51) Int. Cl.
*H01L 33/00*     (2010.01)
*F21V 29/00*     (2006.01)

(52) U.S. Cl. .......... 257/98; 257/E23.101; 257/E33.055; 362/294

(58) Field of Classification Search .......... 257/99, 257/79, E33.001, E33.055, E33.056, 98, 257/E23.101, E23.08; 362/310, 257, 84, 362/294
See application file for complete search history.

(56) References Cited

U.S. PATENT DOCUMENTS

| | | | |
|---|---|---|---|
| 6,501,103 B1 | 12/2002 | Jory et al. | |
| 7,514,718 B2 | 4/2009 | Shin et al. | |
| 2006/0138645 A1* | 6/2006 | Ng et al. | 257/707 |
| 2006/0244118 A1* | 11/2006 | Roberts et al. | 257/686 |
| 2008/0179618 A1 | 7/2008 | Cheng | |

FOREIGN PATENT DOCUMENTS

| | | |
|---|---|---|
| WO | WO2007058438 A1 | 5/2007 |
| WO | WO2009060219 A2 | 5/2009 |

* cited by examiner

*Primary Examiner* — Thomas L Dickey
*Assistant Examiner* — Nikolay Yushin

(57) ABSTRACT

Light sources are disclosed herein. An embodiment of a light sources comprises a substrate having a first surface and a second surface located opposite the first surface. At least one first electrically conductive layer is affixed to the first surface of the substrate and partially covering the first surface of the substrate. At least one second electrically conductive layer is affixed to the first surface of the substrate and partially covering the first surface of the substrate. A light emitter is affixed to the first surface of the substrate in an area not covered by either of the at least one first electrically conductive layer or the at least one second electrically conductive layer.

20 Claims, 2 Drawing Sheets

LIGHT SOURCE

BACKGROUND

Some light sources use a light emitting device such as a light emitting diode (LED) or similar device to generate light. The LED may be located on a substrate that protects the LED and provides a mechanism to provide power to the LED. During generation of light, the LED and, thus, the light source, generate heat. Light sources are becoming smaller and emitting more intense light, which causes them to generate more heat in a smaller volume.

Conventional light sources mount the LED to an electrically conductive element, such as a trace. The portion of the LED mounted to the trace serves as a terminal for the LED. Therefore, only one wire is needed to electrically connect the other terminal of the LED to another trace on the substrate or associated with the substrate. Heat is dissipated from the LED by way of the substrate, but through the trace.

The light source described above may not dissipate heat efficiently because the electrical trace on which the LED is located can act as a thermal insulator. The thermal insulator decreases the thermal conductivity between the LED and the substrate.

SUMMARY

Light sources are disclosed herein. An embodiment of a light sources comprises a substrate having a first surface and a second surface located opposite the first surface. At least one first electrically conductive layer is affixed to the first surface of the substrate and partially covering the first surface of the substrate. At least one second electrically conductive layer is affixed to the first surface of the substrate and partially covering the first surface of the substrate. A light emitter is affixed to the first surface of the substrate in an area not covered by either of the at least one first electrically conductive layer or the at least one second electrically conductive layer.

DETAILED DESCRIPTION

Figure 1:
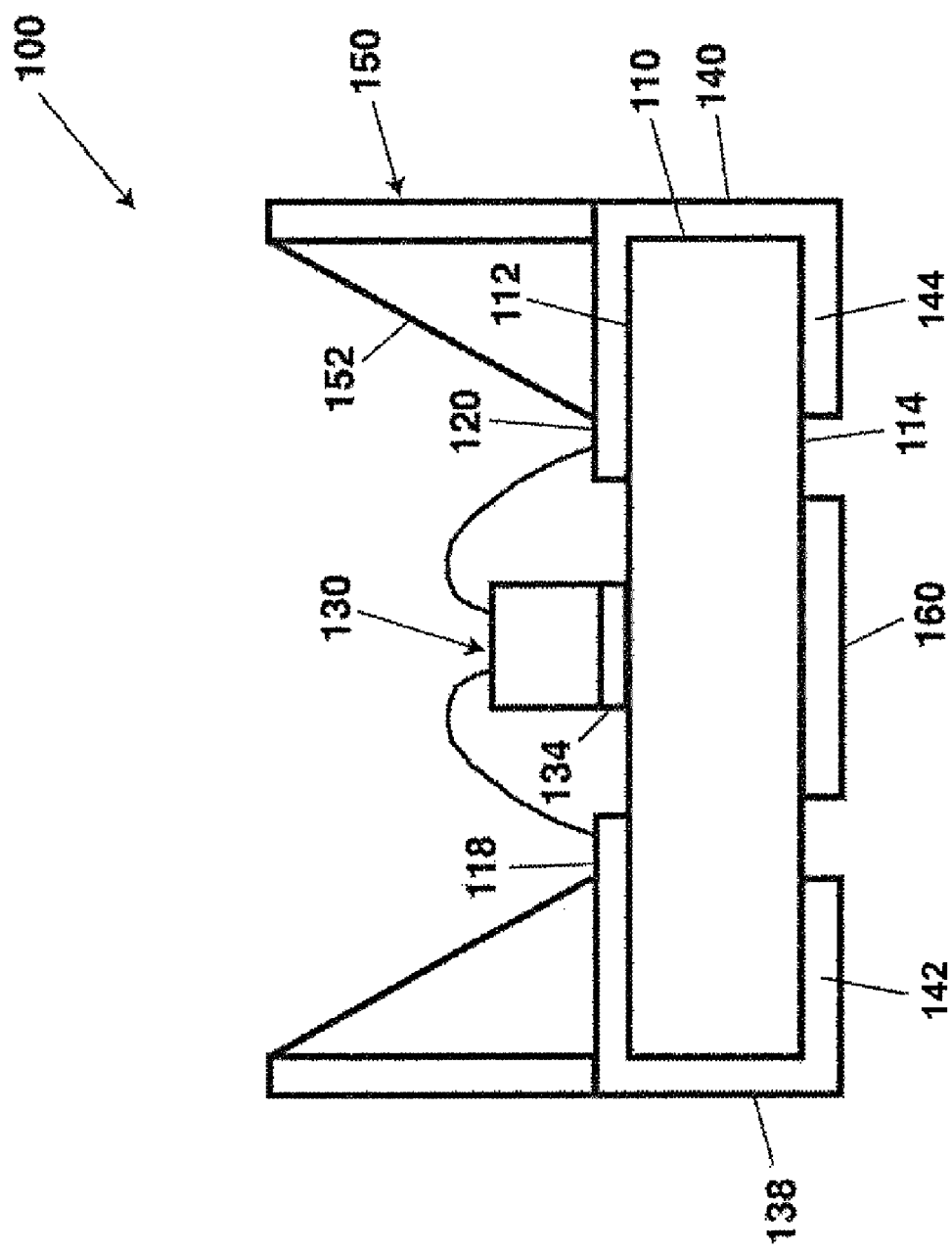
FIG. 1 is a side cut away view of an embodiment of a light source.

An embodiment of a light source 100 is shown in FIG. 1. The light source includes a substrate 110 that has a first surface 112 and a second surface 114 located opposite the first surface 112. The substrate 100 may be a ceramic substrate or may comprise ceramic. Ceramic substrates provide good thermal characteristics for dissipating heat from heat generating components attached to the substrate. In addition, ceramic substrates provide good electrical isolation when used as circuit boards. One of the problems with ceramic substrates is that they are brittle and tend to break easily. This problem is alleviated by the light source described herein. It is noted that the substrate 110 may include materials other than ceramic. For example, the substrate 110 may be made from silicon or other materials.

Electrically conductive layers are located on the first surface 112 of the substrate 100. The light source 100 of FIG. 1 has two electrically conductive layers on the first surface 112, which are referred to herein as a first electrically conductive layer 118 and a second conductive layer 120. In addition, the light source 100 of FIG. 1 may have two electrically conductive layers on the second surface 114, which are referred herein as a third electrically conductive layer 142 and the fourth conductive layer 144. The electrically conductive layers 118, 120, 142 and 144 be electrical traces as are commonly used on printed circuit boards. As described below, the electrically conductive layers 118, 120 do not cover the entire first surface 112 of the substrate 110.

A light emitter 130 is affixed to the first surface 112 of the substrate 110. It is noted that the light emitter 130 is affixed directly to the first surface 112 of the substrate 110 and not to either of the electrically conductive layers 118, 120. An adhesive or epoxy 134, such as a silver epoxy, may be used to affix the light emitter 130 to the first surface 112 of the substrate 110. The light emitter may be a light-emitting diode (LED).

Affixing the light emitter 130 directly to the first surface 112 of the substrate 110 provides several benefits over conventional light sources. One benefit is that the direct adhesion is stronger than adhesion to an electrically conductive layer, so the light emitter 130 is less likely to delaminate from the substrate 110 than in conventional light sources. Another benefit is that heat generated by the light emitter 130 is conducted or dissipated directly to the substrate 110. When a light emitter is affixed to an electrically conductive layer, the electrically conductive layer acts as a thermal insulator, which reduces the heat dissipating properties of the light source.

The electrically conductive layers 118, 120 may have side portions that extend along the sides of the substrate. A first side portion 138 extends along the side of the substrate 110 from the first electrically conductive layer 118, which is connected to the third conductive layer 142. A second side portion 140 extends along the side of the substrate 110 from the second conductive layer 120, which is connected to the fourth conductive layer 144. The side portions 138, 140 enable electric power to be conducted to the light emitter 130. In some embodiments, the light source 100 may use other embodiments, such as plated via holes to conduct electric power to the light emitter 130.

The light source 100 may have a reflector cup 150 attached to the substrate 110. The reflector cup 100 serves to reflect light generated by the light emitter 130 into a specific beam pattern. The reflector cup 150 may have an inner wall 152 that is reflective. The reflective inner wall 152 reflects light to form the above-described beam pattern. The reflector cup 150 may be filled with an encapsulant that serves to protect the component of the light source. The encapsulant may contain phosphor or other particles that change the color of light emitted by the light emitter 130. Therefore, light emitted by the light source 100 may differ from light emitted by the light emitter 130. In some embodiments, the light source 100 does not have a reflector cup. Rather, the light source may use an encapsulation layer to encapsulate the light emitter 130 and the associated parts.

A heat sink 160 may be attached to the substrate 110 approximate the light emitter 130. The heat sink 160 may have a thermal conductivity that is equal to or higher than the substrate 110. In the embodiment of FIG. 1, the heat sink 160 is attached to the lower surface 114 of the substrate 110. The heat sink 160 serves to conduct heat from the substrate 110. Because the heat sink 160 is located approximate the light emitter 130, the heat sink 160 conducts the heat from the light emitter 130. As stated above, the light emitter 130 is attached directly to the first surface 112 of the substrate. Therefore, heat generated by the light emitter 130 conducts directly to the substrate 110 and to the heat sink 160 without passing through any electrical traces that may insulate the light emitter 130.

Having described some embodiments of the light source, other embodiments will now be described.

Figure 2:
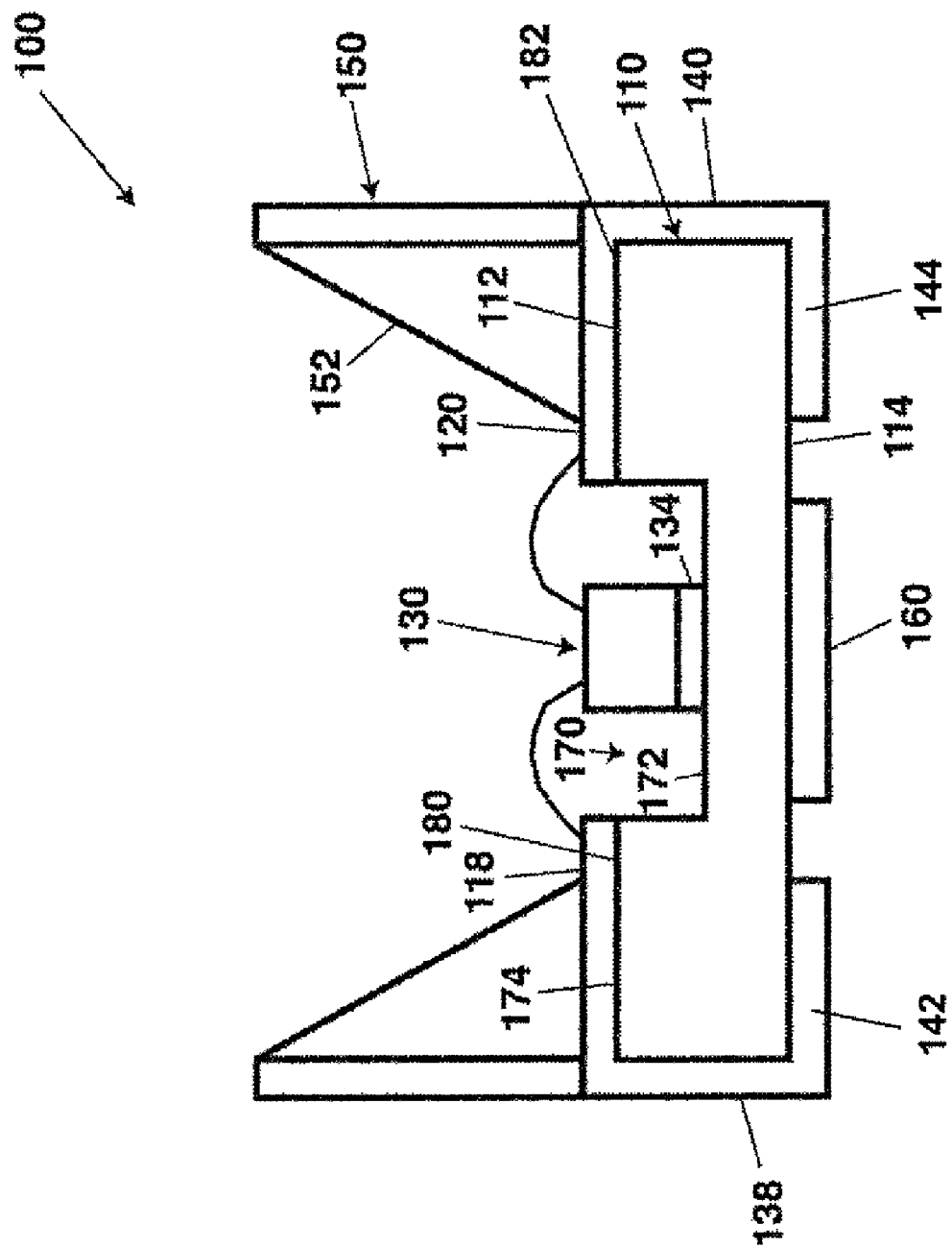
FIG. 2 is another embodiment of the light source of FIG. 1.

Another embodiment of the light source 100 is shown in FIG. 2. As described in greater detail below, the substrate 110 of the light source 100 has a recessed area 170 on which the light emitter 130 is attached. The recessed area 170 provides a thinner substrate 110 in the proximity of the light emitter 130 while providing a thicker and stronger substrate 110 in the remaining areas of the substrate 110. The thinner substrate in the recessed area 170 provides a lower thermal resistance between the light emitter 130 and the heat sink 160, which provides better cooling of the light emitter 130.

The first surface 112 of the substrate of the light source 100 shown in FIG. 2 is described as having a first portion 172 and a second portion 174 that form the recessed portion 170. The distance between the first portion 172 and the second surface 114 of the substrate 110 is less than the distance between the second portion 174 and the second surface 114 of the substrate 110. The light emitter is affixed to the first portion 172 of the first surface 112 of the substrate 110. The first and second conductive layers 118, 120 are located on the second portion 174 of the first surface 112 of the substrate 110. In this embodiment, only the portion of the substrate 110 approximate the light emitter 130 is thin as described above. Thus, only a small portion of the substrate 110 is weakened by being thinner.

In some embodiments, the second portion 174 of the first surface 112 is divided into different sections. The first conductive layer 118 may be attached to a first section of the second portion 174. The second conductive layer 120 may be attached to a second section 176 of the second portion 174 of the first surface 112.

What is claimed is:

1. A light source comprising:
    a substrate having a first surface and a second surface located opposite the first surface;
    at least one first electrically conductive layer affixed to the first surface of the substrate and partially covering the first surface of the substrate, the at least one first electrically conductive layer being substantially more electrically conductive than the substrate;
    at least one second electrically conductive layer affixed to the first surface of the substrate and partially covering the first surface of the substrate, the at least one second electrically conductive layer being substantially more electrically conductive than the substrate;
    at least one third electrically conductive layer affixed to the second surface of the substrate and partially covering the second surface of the substrate, the at least one third electrically conductive layer being substantially more electrically conductive than the substrate;
    a light emitter affixed to the first surface of the substrate in an area not covered by either of the at least one first electrically conductive layer or the at least one second electrically conductive layer, the light emitter comprising a first terminal and a second terminal;
    a heat sink affixed to a portion of the second side of the substrate in an area not covered by the at least third electrically conductive layer approximating the location of the light emitter on the opposite side of the substrate;
    a first conductor connected to first terminal and the at least one first electrically conductive layer; and
    a second conductor connected to the second terminal and the at least one second electrically conductive layer.

2. The light source of claim 1, wherein the distance between the first surface of the substrate and the second surface of the substrate is narrowest in the approximate area of the light emitter.

3. The light source of claim 1, wherein the light emitter is a light-emitting diode.

4. The light source of claim 1, wherein the substrate comprises ceramic.

5. The light source of claim 1, wherein the heat sink and the at least first, second and third conductive layers are thin electrical conductive traces of a printed circuit board.

6. The light source of claim 1, wherein the first surface of the substrate comprises a first portion and a second portion, wherein the distance between the first portion and the second surface is less than the distance between said the second portion and the second surface, wherein the light emitter is located on the first portion, and wherein the at least one first electrically conductive layer is located on the second portion.

7. The light source of claim 6, wherein the light emitter is affixed to the first surface of the first portion of the substrate.

8. The light source of claim 6, wherein at least a portion of the first conductive layer is attached to the second portion of the first surface of the substrate.

9. The light source of claim 6, wherein the second portion comprises a first section and a second section, wherein at least a portion of the first conductive layer is attached to the first section and wherein at least a portion of the second conductive layer is attached to the second section.

10. A light source comprising:
    a substrate having a first surface and a second surface located opposite the first surface, wherein the first surface comprises a first portion and a second portion, wherein the distance between the first portion and the second surface is less than the distance between the second portion and the second surface, wherein the at least one first electrically conductive layer is located on the second portion;
    at least one first electrically conductive layer affixed to the first surface of the substrate and partially covering the first surface of the substrate, the at least one first electrically conductive layer being substantially more electrically conductive than the substrate;
    at least one second electrically conductive layer affixed to the first surface of the substrate and partially covering the first surface of the substrate, the at least one second electrically conductive layer being substantially more electrically conductive than the substrate;
    at least one third electrically conductive layer affixed to the second surface of the substrate and partially covering the second surface of the substrate, the at least third electrically conductive layer being substantially more electrically conductive than the substrate;
    a light emitter affixed to the first portion of the first surface of the substrate in an area not covered by either of the at least one first electrically conductive layer or the at least one second electrically conductive layer, the light emitter comprising a first terminal and a second terminal;
    a heat sink affixed to a portion of the second side of the substrate in an area not covered by the at least third electrically conductive layer approximating location of the light emitter on the opposite side of the substrate;
    a first conductor connected to the first terminal and the at least one first electrically conductive layer; and
    a second conductor connected to the second terminal and the at least one second electrically conductive layer.

11. The light source of claim 10, wherein the distance between the first surface of the substrate and the second surface of the substrate is narrowest in the approximate area of the light emitter.

12. The light source of claim 10, wherein the light emitter is affixed to the first surface of the first portion of the substrate.

13. The light source of claim 10, wherein at least a portion of the first conductive layer is attached to the second portion of the first surface of said the substrate.

14. The light source of claim 10, wherein the second portion comprises a first section and a second section, wherein at least a portion of the first conductive layer is attached to the first section and wherein at least a portion of the second conductive layer is attached to the second section.

15. The light source of claim 10, wherein the light emitter is a light-emitting diode.

16. The light source of claim 10, wherein the substrate comprises ceramic.

17. The light source of claim 10, wherein the heat sink and the at least first, second and third conductive layers are thin electrical conductive traces of a printed circuit board.

18. A light source comprising:
- a substrate having a first surface, and a second surface located opposite the first surface, wherein the substrate is formed from electrically insulating material;
- at least one first electrically conductive trace located on the first surface of the substrate and partially covering the first surface of the substrate;
- at least one second electrically conductive trace located on the first surface of the substrate and partially covering the first surface of the substrate;
- at least one third electrically conductive trace located on the second surface of the substrate and partially covering the second surface of the substrate;
- a light emitter affixed to the first surface of the substrate in an area not covered by either of the at least one first or second electrically conductive layers, the light emitter comprising a first terminal and a second terminal;
- a heat sink located on the second side of the substrate in an area not covered by the at least third electrically conductive layer, the heat sink in the approximate location of the light emitter on opposite side of the substrate;
- a first conductor connected to the first terminal and the at least one first electrically conductive layer; and
- a second conductor connected to the second terminal and the at least one second electrically conductive layer.

19. The light source of claim 18, wherein the distance between the first surface of the substrate and the second surface of the substrate is least in the area approximating the light emitter.

20. The light source of claim 18, wherein the heat sink is a thin electrically conductive trace.

* * * * *